United States Patent [19]
Han et al.

[11] Patent Number: 5,821,558
[45] Date of Patent: Oct. 13, 1998

[54] ANTIFUSE STRUCTURES

[75] Inventors: Yu-Pin Han, Dallas, Tex.; Ying-Tsong Loh, Saratoga, Calif.; Ivan Sanchez, San Antonio, Tex.

[73] Assignee: VLSI Technology, Inc., San Jose, Calif.

[21] Appl. No.: 792,791

[22] Filed: Feb. 3, 1997

Related U.S. Application Data

[62] Division of Ser. No. 582,844, Dec. 29, 1995.

[51] Int. Cl.$^6$ .............................. H01L 29/04; H01L 27/02
[52] U.S. Cl. ................................ 257/52; 257/50; 257/54; 257/530
[58] Field of Search ................................ 257/50, 52, 54, 257/530

[56] References Cited

U.S. PATENT DOCUMENTS

| | | | |
|---|---|---|---|
| 4,174,521 | 11/1979 | Neale | 357/45 |
| 4,420,766 | 12/1983 | Kasten | 357/59 |
| 4,497,974 | 2/1985 | Deckman et al. | 136/259 |
| 4,499,557 | 2/1985 | Holmberg et al. | 365/163 |
| 4,538,167 | 8/1985 | Yoshino et al. | 357/59 |
| 4,569,120 | 2/1986 | Stacy et al. | 29/574 |
| 5,120,679 | 6/1992 | Boardman et al. | 437/195 |
| 5,238,868 | 8/1993 | Conti et al. | 437/203 |
| 5,272,666 | 12/1993 | Tsang et al. | 365/96 |
| 5,290,734 | 3/1994 | Boardman et al. | 437/195 |
| 5,298,784 | 3/1994 | Gambino et al. | 257/529 |
| 5,300,456 | 4/1994 | Tigelaar et al. | 257/530 |
| 5,311,039 | 5/1994 | Kimura et al. | 257/50 |
| 5,373,169 | 12/1994 | McCollum et al. | 257/50 |
| 5,381,035 | 1/1995 | Chen et al. | 257/530 |
| 5,404,029 | 4/1995 | Husher et al. | 257/50 |
| 5,486,707 | 1/1996 | Look et al. | 257/52 |
| 5,593,920 | 1/1997 | Haslam et al. | 257/530 |

OTHER PUBLICATIONS

Unknown, "Developments in non–volatile FPGAs," Electronic Engineering, Apr. 1993.

Gordon, Kathryn E., "Conducting Filament of the Programmed Metal Electrode Amorphous Silicon Antifuse," IEDM 1993, pp. 2.6.1–2.6.4.

Hu, Chenming, "Interconnect Devices for Field Programmable Gate Array," IEEE 1992, pp. 24.1.1–24.1.4.

Diamand, Yoshi Shachem, Filament Formation and the Final Resistance Modeling in Amorphous–Silicon Vertical Programmable Element, IEEE 1993, pp. 1780–1788.

*Primary Examiner*—Valenna Martin Wallace
*Attorney, Agent, or Firm*—Hickman & Martine, LLP

[57] ABSTRACT

An antifuse structure includes a first electrode, a layer of enhanced amorphous silicon over the first electrode, and a second electrode over the layer of enhanced amorphous silicon. The layer of enhanced amorphous silicon is formed by an ion-implantation of a neutral species and a dopant species into a deposited layer of amorphous silicon, such that the antifuse structure will have a stable conductive link in a programmed state and such that it will be less susceptible to off-state leakage in an unprogrammed state. A method for making an antifuse structure includes forming a lower electrode, depositing an amorphous silicon layer over the lower electrode, ion-implanting a neutral species and a dopant species into the amorphous silicon layer, and forming an upper electrode over the amorphous silicon layer.

24 Claims, 10 Drawing Sheets

ANTIFUSE STRUCTURES

This is a Divisional application of copending prior application Ser. No. 08/582,844 filed on Dec. 29, 1995.

BACKGROUND OF THE INVENTION

The present invention relates generally to electronic integrated circuit (IC) technology. More particularly, the invention relates to electrically programmable antifuse structures.

Antifuses can be used to selectively couple together ("program") logic elements of a field programmable gate array (FPGA) to perform user-defined functions. Alternatively, antifuses can serve as memory elements of a programmable read-only memory (PROM). Antifuses have the advantageous feature of being small in size, allowing a large number of the antifuses to be provided on a single device, and thereby providing the capability of making a great number of interconnections or storing a large amount of information. Antifuses and methods for making antifuses are described in U.S. Pat. Nos. 5,120,679, 5,290,734, and 5,328,868, the disclosures of which are incorporated herein by reference.

Antifuses include a material which initially has a high resistance ("unprogrammed" or "off" or "0" state) but which can be converted into a low resistance material ("programmed" or "on" or "1" state) by the application of a programming voltage. Programmed antifuses can selectively couple together logic elements in an FPGA, and the combination of programmed and unprogrammed antifuses can serve as PROM memory elements.

Figures 1, 1A, 1B:
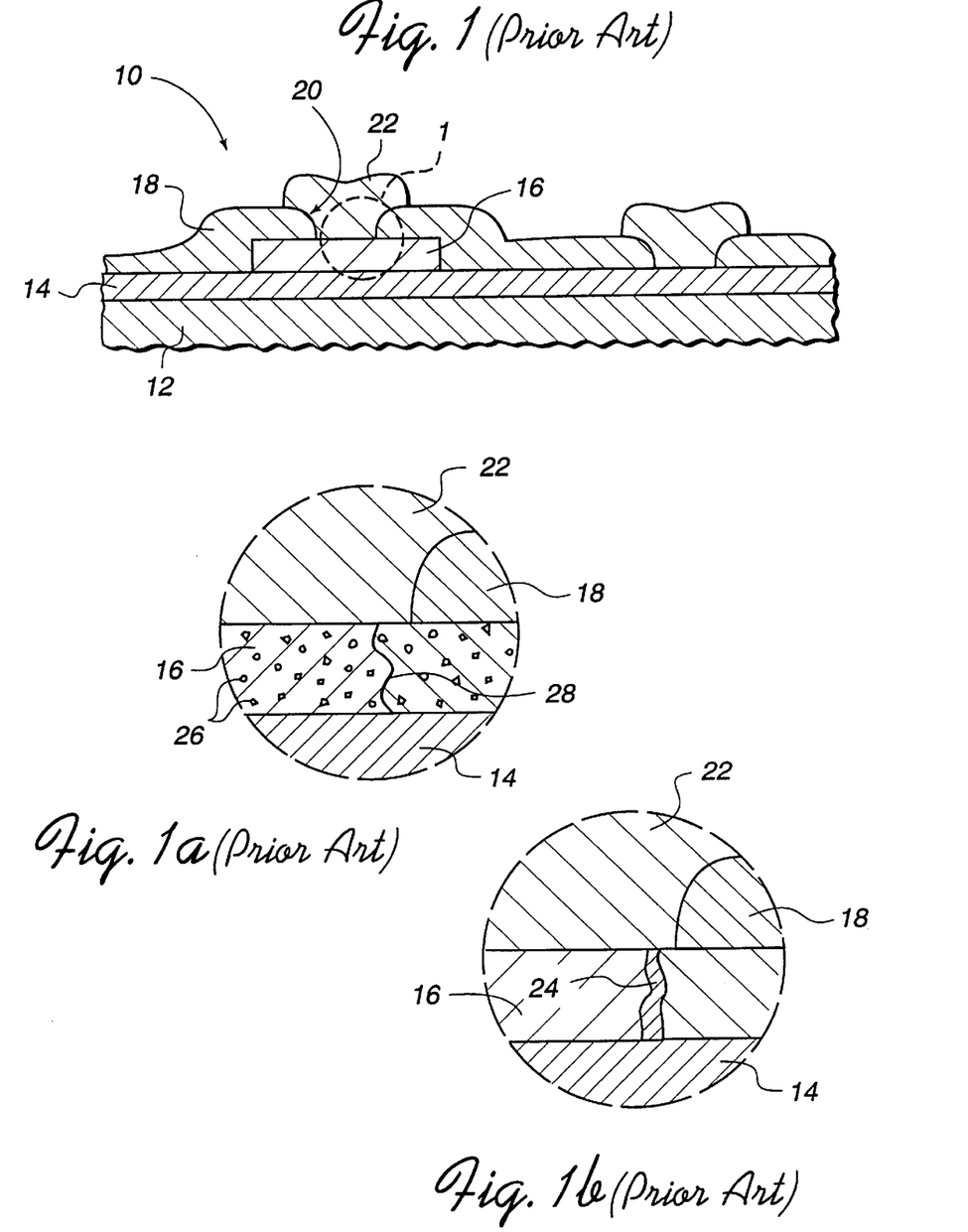
FIG. 1 is a cross section of a conventional metal electrode amorphous silicon antifuse.
FIGS. 1a and 1b are enlarged views of the antifuse amorphous silicon layer that is encircled by line 1 in FIG. 1, respectively showing unprogrammed off state leakage and a programmed conducting filament.

FIG. 1 shows a conventional metal electrode amorphous silicon antifuse 10 which includes substrate 12, metal bottom electrode 14, amorphous silicon (a-Si) layer 16, inter-metal oxide layer 18, via hole 20, and metal top electrode 22. Substrate 12 is typically a silicon wafer, electrodes 14 and 22 are typically a TiW, Al, TiW sandwich, and oxide layer 18 is typically $SiO_2$. The formation of these layers are well known to those skilled in the art. Antifuse 10 may be programmed by applying a sufficiently large voltage (e.g. 15 volts dc) to top electrode 22 while bottom electrode 14 is grounded, or vice versa.

Metal electrode amorphous silicon antifuses are typically manufactured using amorphous silicon deposition processes to form deposited amorphous silicon films of the antifuses. Typical amorphous silicon deposition processes include chemical vapor deposition (CVD), plasma enhanced chemical vapor deposition (PECVD), and low pressure chemical vapor deposition (LPCVD). Relatively low temperatures are used in these processes (about 400° C. for CVD and PECVD, and about 600°–700° C. for LPCVD so as to avoid damage to logic devices, such as CMOS transistors, formed previously in the substrate over which the antifuses are formed.

FIG. 1a shows amorphous silicon layer 16 as deposited with low temperature amorphous silicon deposition processes. Amorphous silicon layer 16 created by conventional processes are believed to include relatively conductive polysilicon regions or "islands" 26 within the a-Si matrix of silicon layer 16. Polysilicon islands 26 can lead to a phenomenon known as "off-state leakage" in which an electrically conductive path 28 may be formed in unprogrammed antifuse 10 between upper electrode 22 and lower electrode 14 by jumping from one polysilicon island 26 to another through silicon layer 16.

FIG. 1b illustrates amorphous silicon layer 16 after antifuse 10 is programmed. One or more conducting filaments 24 are believed to be formed by the electro-migration of electrode material into the amorphous silicon 16. A description of conducting filaments in programmed antifuse devices may be found in the paper "Conducting Filament of the Programmed Metal Electrode Amorphous Silicon Antifuse", K. Gordon and R. Wong, *IEDM Tech. Dig.*, p. 27, December 1993, incorporated herein by reference.

A problem often encountered with conventional antifuses is known as deprogramming, in which after an antifuse has been subjected to a programming voltage believed to be sufficient to program the antifuse to an "on" state, it is later found that such antifuse is instead in an unprogrammed "off" state. Deprogramming refers to either the situation in which no adequately conducting filament has been formed by the application of a programming voltage to the antifuse, or to a tendency of the resistance of a weakly "programmed" antifuse to increase with time such that it is no longer adequately conductive. Adequately programmed antifuses should remain it their low resistance states in order to provide reliable operation, for example, of the circuit in which they are incorporated.

It is apparent from the foregoing that what is needed is an antifuse structure which reliably remains conductive ("on") after it has been programmed and which reliably remains nonconductive ("off") if it has not been programmed.

SUMMARY OF THE INVENTION

According to the present invention, an antifuse structure is provided which is less susceptible to off-state leakage than conventional antifuse structures and which is efficiently programmable to reliably remain in its "on" state.

In a preferred embodiment, the antifuse structure of the present invention includes, a first electrode, a layer of enhanced amorphous silicon over the first electrode, and a second electrode over the layer of enhanced amorphous silicon. The layer of enhanced amorphous silicon is formed by an ion-implantation of at least one of a neutral species and a dopant species into a deposited layer of amorphous silicon. An antifuse structure according to the invention will have a stable conductive link in a programmed state and it will be less susceptible to off-state leakage in an unprogrammed state.

A method for making an antifuse structure according to the present invention includes forming a lower electrode, depositing an amorphous silicon layer over the lower electrode, ion-implanting at least one of a neutral species and a dopant species into the amorphous silicon layer, and forming an upper electrode over the amorphous silicon layer. The amorphousness of the silicon layer is enhanced by subjecting it to the neutral species implantation, which advantageously creates a high electrical resistance between the electrodes of the antifuse in an unprogrammed state, while the dopant species implantation advantageously enhances the silicon layer such that a reliably stable conductive link is more effectively formed therein between the electrodes of the antifuse during programming.

These and other advantages of the present invention will become clear to those skilled in the art upon a study of the detailed description of the invention and of the several figures of the drawings, wherein like reference numerals indicate like elements of the invention.

DETAILED DESCRIPTION OF THE PREFERRED EMBODIMENTS

Figure 2:
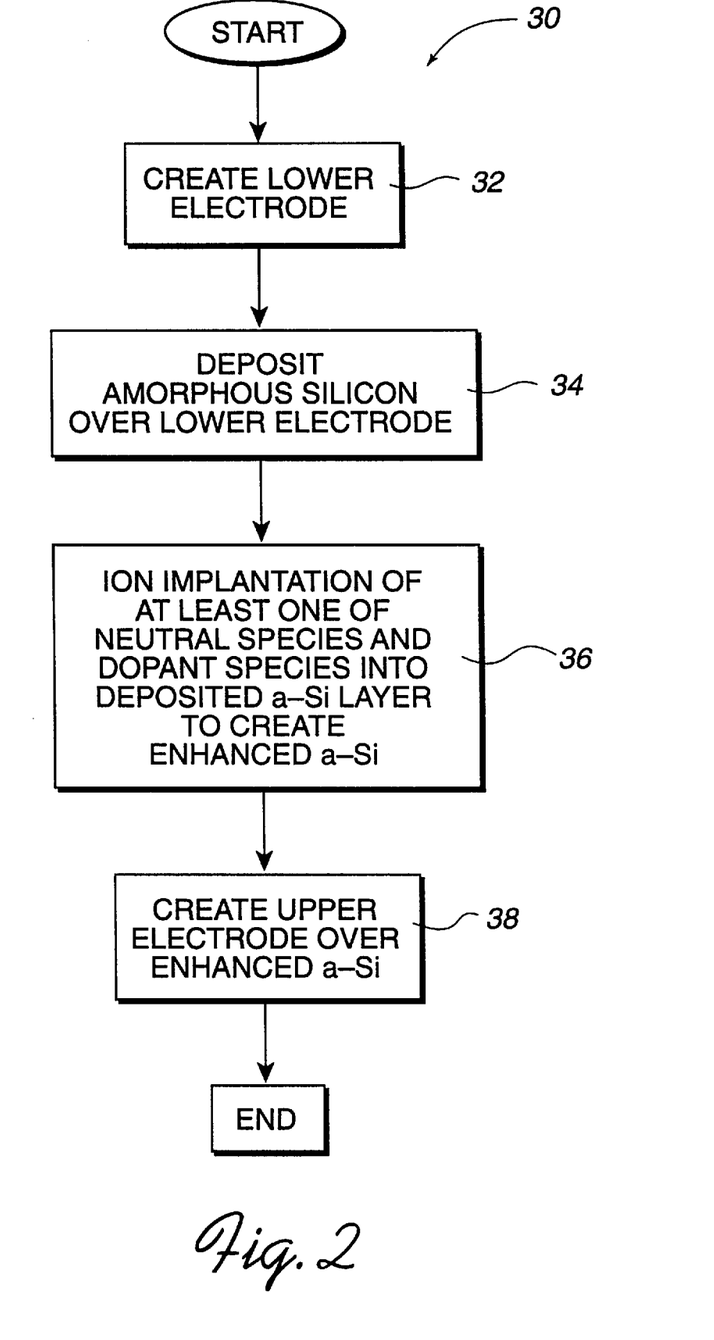
FIG. 2 is a flow diagram of the process of the present invention.

FIGS. 1, 1a and 1b were discussed with reference to the prior art. FIG. 2 illustrates a basic process 30 according to the present invention for making an improved antifuse structure. In a first step 32, a lower electrode is provided for the antifuse structure. This lower electrode is preferably formed over a substrate, in which a plurality of logic devices such as CMOS transistors have preferably been previously formed. In a step 34, a layer of amorphous silicon (a-Si) is provided over the lower electrode. The amorphous silicon layer is formed preferably by conventional amorphous silicon deposition processes such as CVD, PECVD, LPCVD, and sputter deposition processes, and preferably by these amorphous silicon deposition processes at low-temperature which as defined herein refers to a process temperature in the range of about 400° to 500° C. for CVD and PECVD and about 600°–700° C. for LPCVD. In a step 36, an ion implantation of at least one of a neutral species and a dopant species into the amorphous silicon layer deposited in step 34 is performed. Preferably, the neutral species of ion implantation step 36 is chosen from the group including Argon, Oxygen, Nitrogen, Silicon, and Germanium, while the dopant species is an n-type dopant such as, most commonly, Phosphorus (P+) or Arsenic (As+), or a p-type dopant such as, most commonly, Boron (B+). Finally, in a step 38, an upper electrode is provided over at least a portion of the amorphous silicon layer which has been enhanced in step 36.

Ion implantation step 36 creates an "enhanced" amorphous silicon layer for the antifuse structure of the present invention. As used herein, an enhanced amorphous silicon layer refers to a layer of amorphous silicon deposited in a conventional amorphous silicon deposition process preferably at low-temperature, such as CVD, PECVD, and LPCVD processes, which has been subjected to an ion implantation of at least one of a neutral species and a dopant species. The neutral species ion implantation creates an enhanced amorphous silicon layer which has a higher degree of amorphousness than the deposited amorphous silicon layer, thereby to decrease the presence of polysilicon regions and minimize the occurrence of off-state leakage of the unprogrammed antifuse structure. The dopant species ion implantation creates an enhanced amorphous silicon layer for an antifuse structure which permits a decisive and stable conducting link to be formed upon programming, thereby to ensure that the antifuse structure has been adequately and reliably programmed.

Preferably, step 34 provides a layer of amorphous silicon which is deposited with a thickness between about 400–2000 Å, while step 36 includes implanting Argon with an implant energy between about 20–80 keV and an implant density of about $1\times10^{12}$–$1\times10^{16}$ ions $cm^{-2}$. Even more preferably, step 34 provides a layer of amorphous silicon which is deposited with a thickness between about 1150–1350 Å, while step 36 includes implanting Argon with an implant energy between about 25–65 keV and an implant density of about $1\times10^{15}$–$1\times10^{16}$ ions $cm^{-2}$. Preferably, step 34 provides a layer of amorphous silicon which is deposited with a thickness of about 1250 Å, while step 36 includes implanting Argon with an implant energy of about 47 keV and an implant density of about $5\times10^{15}$ ions $cm^{-2}$.

According to the invention, the following ranges are employed in an n-type dopant ion implantation for step 36. Preferably, step 34 provides a layer of amorphous silicon which is deposited with a thickness between about 400–2000 Å, while step 36 includes implanting Phosphorous with an implant energy between about 30–40 keV and an implant density of about $1\times10^{13}$–$1\times10^{16}$ ions $cm^{-2}$. Also preferably, step 34 provides a layer of amorphous silicon which is deposited with a thickness between about 1150–1350 Å, while step 36 includes implanting Phosphorous with an implant energy between about 20–60 keV and an implant density of about $1\times10^{12}$–$1\times10^{14}$ ions $cm^{-2}$. Preferably, step 34 provides a layer of amorphous silicon which is deposited with a thickness of about 1250 Å, while step 36 includes implanting Phosphorous with an implant energy of about 37 keV and an implant density of about $5\times10^{14}$ ions $cm^{-2}$.

According to the invention, the following ranges are employed in a p-type dopant ion implantation for step 36. Preferably, step 34 provides a layer of amorphous silicon which is deposited with a thickness between about 400–2000 Å, while step 36 includes implanting Boron with an implant energy between about 40–80 keV and an implant density of about $1\times10^{13}$–$1\times10^{16}$ ions $cm^{-2}$. Even more preferably, step 34 provides a layer of amorphous silicon which is deposited with a thickness between about 1150–1350 Å, while step 36 includes implanting Boron with an implant energy between about 45–90 keV and an implant density of about $1\times10^{12}$–$1\times10^{14}$ ions $cm^{-2}$. According to a preferred embodiment of the present invention, step 34 provides a layer of amorphous silicon which is deposited with a thickness of about 1250 Å, while step 36 includes implanting Boron with an implant energy of about 67 keV and an implant density of about $5\times10^{14}$ ions $cm^{-2}$.

As described previously, step 36 includes an ion implantation of at least one of a neutral species and a dopant species into the amorphous silicon layer deposited in step 34. Accordingly in the preferred embodiments of the present invention, step 36 may include any single neutral species ion implantation or dopant species ion implantation in the ranges given above, or any combination of neutral species and dopant species ion implantations in the ranges given above. A single neutral ion implantation provides an enhanced amorphous silicon layer which has a higher degree of amorphousness than the deposited amorphous silicon layer, thereby to decrease the presence of polysilicon regions and minimize the occurrence of off-state leakage of the unprogrammed antifuse structure. A single dopant species ion implantation provides an enhanced amorphous silicon layer for an antifuse structure which permits a decisive and stable conducting link to be formed upon programming, thereby to ensure that the antifuse structure has been adequately and reliably programmed. In a preferred embodiment, a combined neutral ion implantation and dopant species ion implantation provides an enhanced amorphous silicon layer which both minimizes off-state leakage and ensures adequate and reliable programming.

Figure 2A:
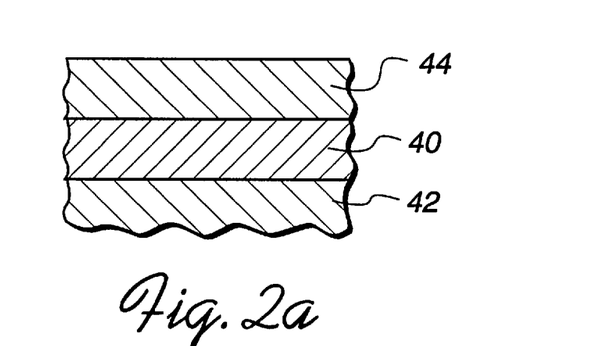
FIGS. 2a–2c are cross sections illustrating the manufacturing steps for an antifuse structure made in accordance with the process of FIG. 2.
Figure 2B:
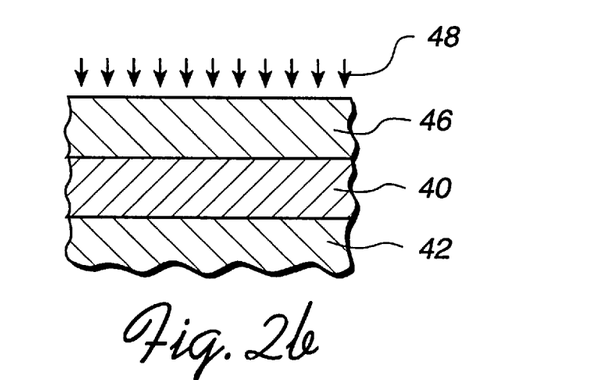
Figure 2C:
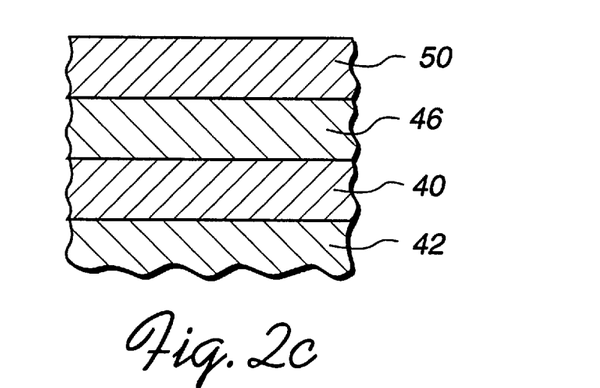

FIGS. 2a–2c sequentially illustrate the structures produced by the respective steps of process 30. In FIG. 2a, a first electrically conductive electrode 40 is arranged over a substrate 42, and an amorphous silicon layer 44 is arranged over first electrode 40 such that a first surface of amorphous silicon layer 44 is in electrical contact with first electrode 40. Substrate 42 is preferably a silicon wafer, and first electrode 40 is preferably made of metal and preferably formed by a sputter deposition process. Even more preferably, first electrode 40 is a TiW, Al, TiW three layer sandwich.

In FIG. 2b, a layer of enhanced amorphous silicon 46 is arranged over first electrode 40. Enhanced amorphous silicon layer 46 is formed by an ion-implantation 48 of at least one of a neutral species and a dopant species into deposited layer of amorphous silicon 44. A first surface of enhanced amorphous silicon layer 46 is in electrical contact with first electrode 40. In FIG. 2c, a second electrically conductive electrode 50 is arranged in electrical contact with a second surface of enhanced amorphous silicon layer 46 opposite the first surface thereof. Preferably, second electrode 50 is made of metal, and preferably formed by a sputter deposition process. Even more preferably, second electrode is Titanium-Tungsten (TiW). First electrode 40, enhanced amorphous silicon layer 46, and second electrode 50 together form an antifuse structure in accordance with the present invention.

Figure 2D:
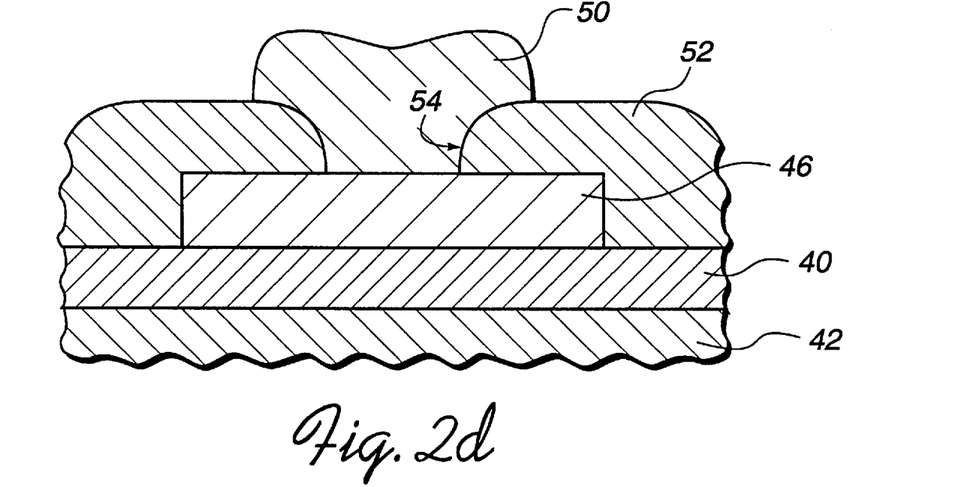
FIG. 2d is a cross section illustrating one preferred embodiment of an antifuse structure made in accordance with the process of FIG. 2.

In a preferred embodiment, process 30 further includes a step of forming an insulator or dielectric layer over the amorphous silicon layer, such that the dielectric layer includes a via hole aligned with a portion of the amorphous silicon layer. In this case, step 38 includes forming the upper electrode in contact with the amorphous silicon layer through the via hole of the dielectric layer. FIG. 2d shows an antifuse structure manufactured according to this preferred embodiment, in which a dielectric layer 52, including a via hole 54, is formed in contact with enhanced amorphous silicon layer 46. Second electrode 50 contacts enhanced amorphous silicon layer 46 through via hole 54. Preferably, dielectric layer 52 with via hole 54 is formed in a manner well known to those skilled in the art, by depositing a layer of $SiO_2$ in an LPCVD or PECVD deposition process, and then patterning (masking and etching) the $SiO_2$ layer to form via hole 54.

Dielectric layer 52 with via hole 54 may be formed before or after amorphous silicon layer 46 is enhanced by ion implantation. Dielectric layer 52 acts as a mask during any subsequent ion implantation which therefore occurs substantially only at the portion of amorphous silicon layer 46 which is aligned with via hole 54.

Figure 3:
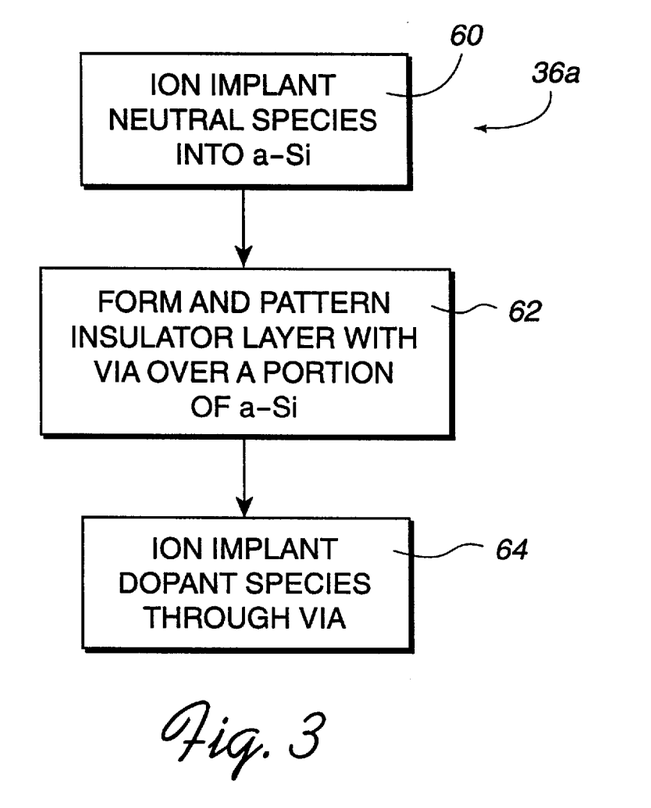
FIG. 3 is a flow diagram of one embodiment of ion implantation steps of the process of the present invention.

Several preferred methods of forming an antifuse structure according to the invention, and in particular preferred methods of carrying out ion-implantation step 36, will now be described. In FIG. 3, one embodiment 36a of ion-implantation step 36 includes a first step 60 of ion-implanting the deposited amorphous silicon layer with a neutral species, a subsequent step 62 of forming and patterning an insulator layer with a via over a portion of the amorphous silicon layer, and a subsequent step 64 of ion-implanting the amorphous silicon layer with a dopant species through the via of the insulator layer.

Figure 3A:
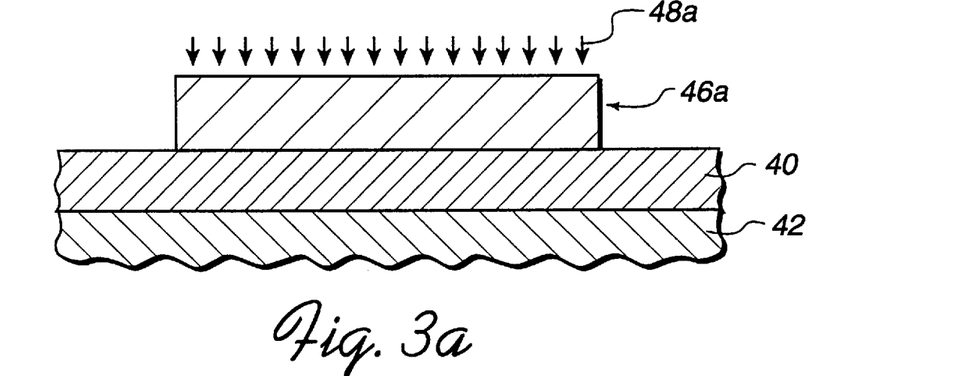
FIGS. 3a–3c are cross sections illustrating the manufacturing steps for an antifuse structure made in accordance with the steps of FIG. 3.
Figure 3B:
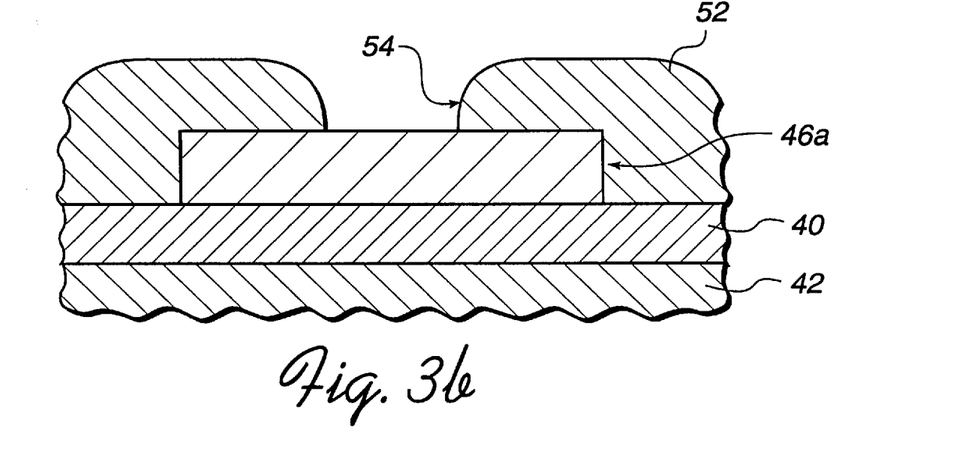
Figure 3C:
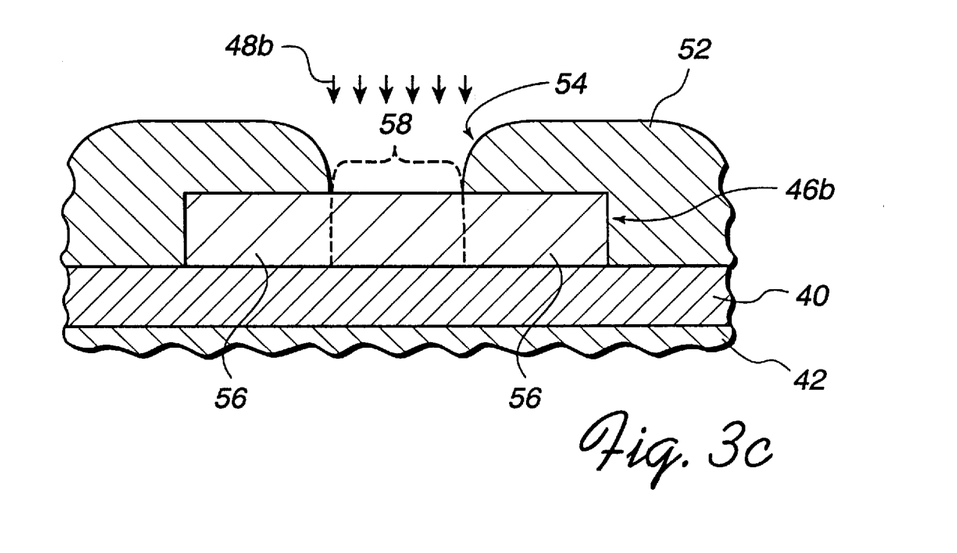

FIGS. 3a–3c sequentially illustrate the structures produced by several preferred steps of process 36a. In FIG. 3a, an enhanced amorphous silicon layer 46a is formed by a neutral species ion-implantation 48a of the deposited amorphous silicon layer. In FIG. 3b, dielectric layer 52 with via hole 54 is formed over enhanced amorphous silicon layer 46a. In FIG. 3c, an enhanced amorphous silicon layer 46b is formed by a dopant species ion-implantation 48b through via hole 54. As an end result, enhanced amorphous silicon layer 46b therefore includes exclusively neutral species implanted portions 56 aligned substantially below dielectric layer 52 and a neutral species and dopant species implanted portion 58 aligned substantially with via hole 54.

Figure 4:
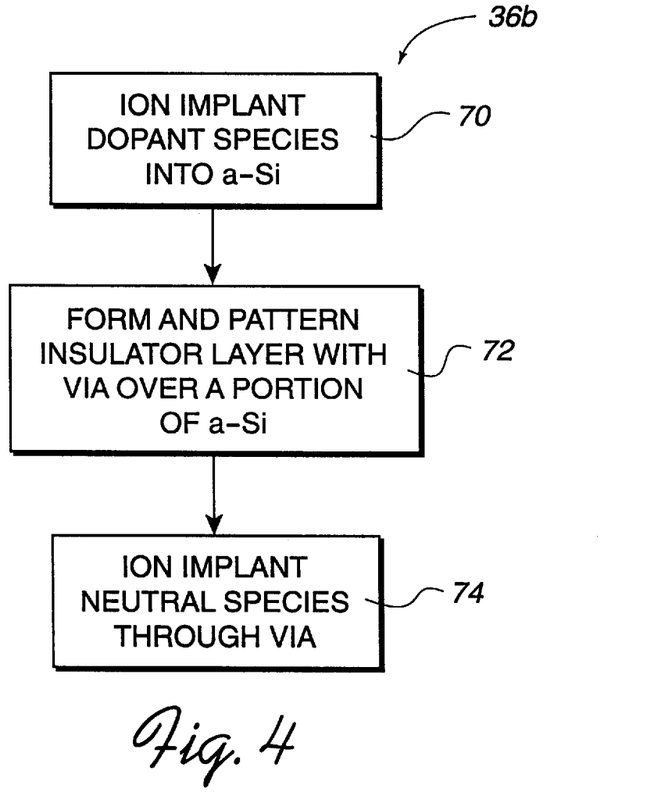
FIG. 4 is a flow diagram of another embodiment of ion implantation steps of the process of the present invention.

In FIG. 4, another embodiment 36b of ion-implantation step 36 includes a first step 70 of ion-implanting the deposited amorphous silicon layer with a dopant species, a subsequent step 72 of forming and patterning an insulator layer with a via over a portion of the amorphous silicon layer, and a subsequent step 74 of ion-implanting the amorphous silicon layer with a neutral species through the via of the insulator layer.

Figure 4A:
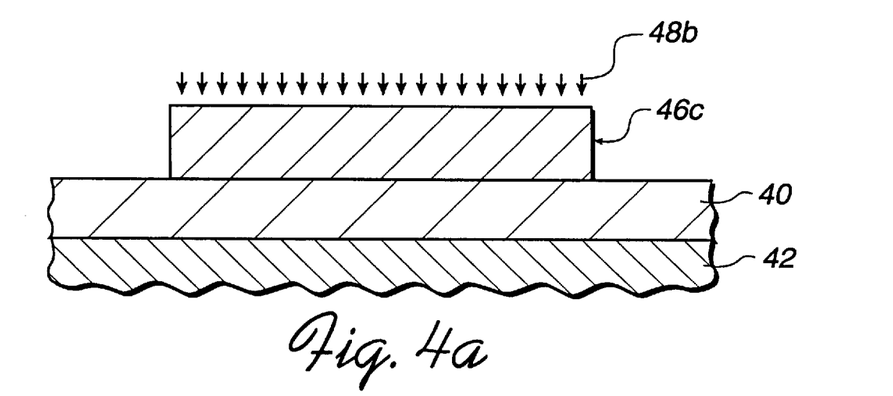
FIGS. 4a–4c are cross sections illustrating the manufacturing steps for an antifuse structure made in accordance with the steps of FIG. 4.
Figure 4B:
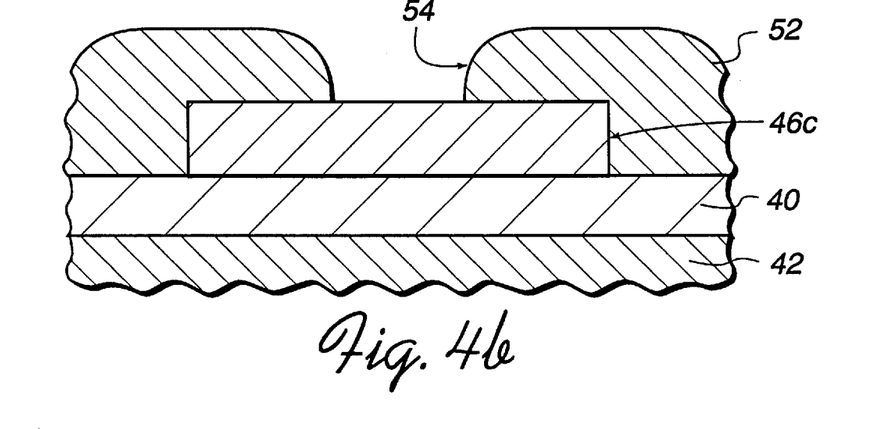
Figure 4C:
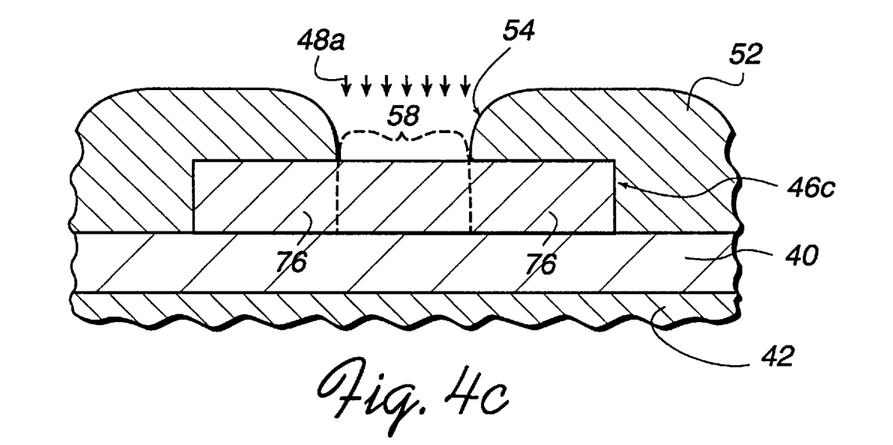

FIGS. 4a–4c sequentially illustrate the structures produced by some preferred steps of process 36b. In FIG. 4a, an enhanced amorphous silicon layer 46c is formed by dopant species ion-implantation 48b of the deposited amorphous silicon layer. In FIG. 4b, dielectric layer 52 with via hole 54 is formed over enhanced amorphous silicon layer 46c. In FIG. 3c, an enhanced amorphous silicon layer 46d is formed by neutral species ion-implantation 48a through via hole 54. As an end result, enhanced amorphous silicon layer 46d therefore includes neutral species and dopant species implanted portion 58 aligned substantially with via hole 54, and exclusively dopant species implanted portions 76 aligned substantially below dielectric layer 52.

Figure 5:
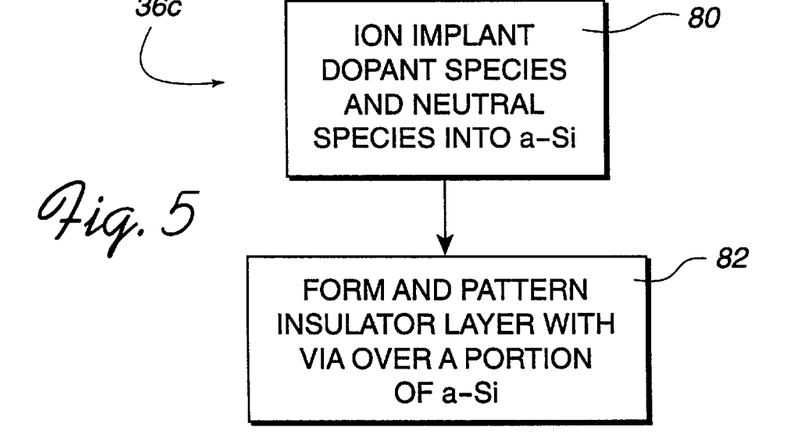
FIG. 5 is a flow diagram of another embodiment of ion implantation steps of the process of the present invention.

In FIG. 5, another embodiment 36c of ion-implantation step 36 includes a first step 80 of ion-implanting the deposited amorphous silicon layer with both a dopant species and a neutral species, and a subsequent step 82 of forming and patterning an insulator layer with a via over a portion of the amorphous silicon layer.

Figure 5A:
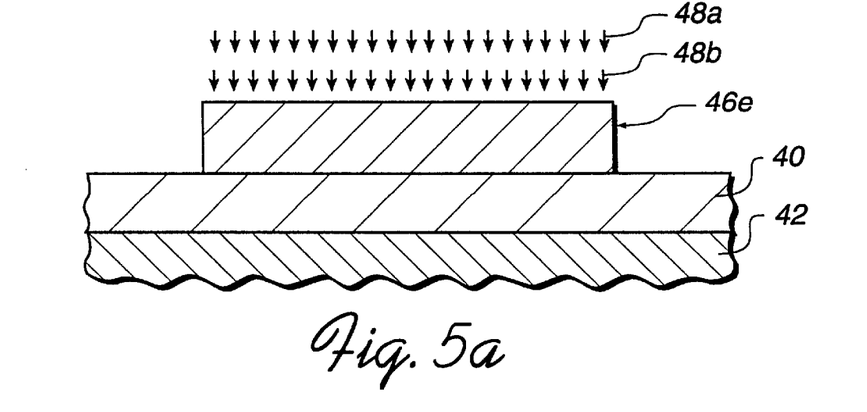
FIGS. 5a–5b are cross sections illustrating the manufacturing steps for an antifuse structure made in accordance with the steps of FIG. 5.
Figure 5B:
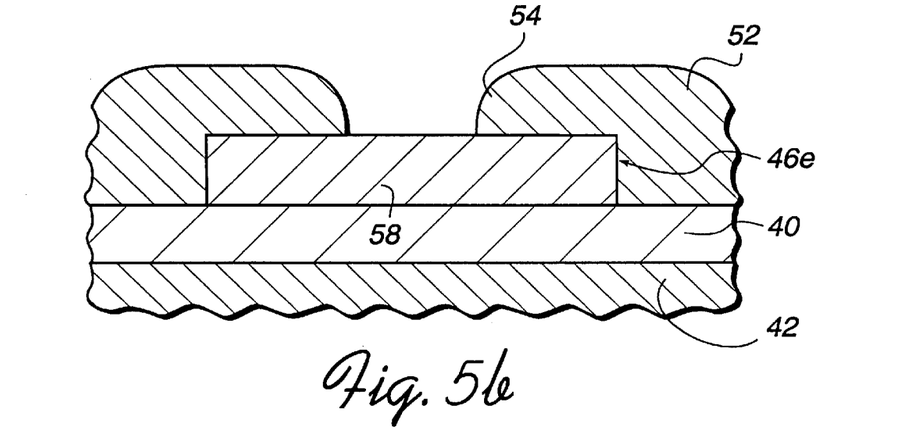

FIGS. 5a–5b sequentially illustrate the structures produced by some preferred steps of process 36c. In FIG. 5a, an enhanced amorphous silicon layer 46e is formed by dopant species ion-implantation 48b and by neutral species ion-implantation 48a of the deposited amorphous silicon layer. In FIG. 5b, dielectric layer 52 with via hole 54 is formed over enhanced amorphous silicon layer 46b. Enhanced amorphous silicon layer 46e therefore includes neutral species and dopant species implanted portion 58 aligned substantially with via hole 54 and below dielectric layer 52.

Figure 6:
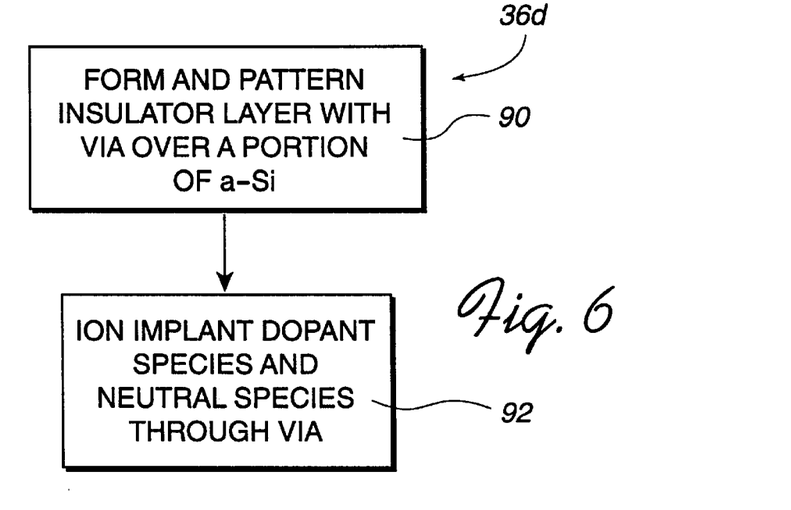
FIG. 6 is a flow diagram of still another embodiment of ion implantation steps of the process of the present invention.

In FIG. 6, another embodiment 36d of ion-implantation step 36 includes a first step 90 of forming and patterning an insulator layer with a via over a portion of the deposited amorphous silicon layer, and a subsequent step 92 of ion-implanting the deposited amorphous silicon layer with both a dopant species and a neutral species through the via.

Figure 6A:
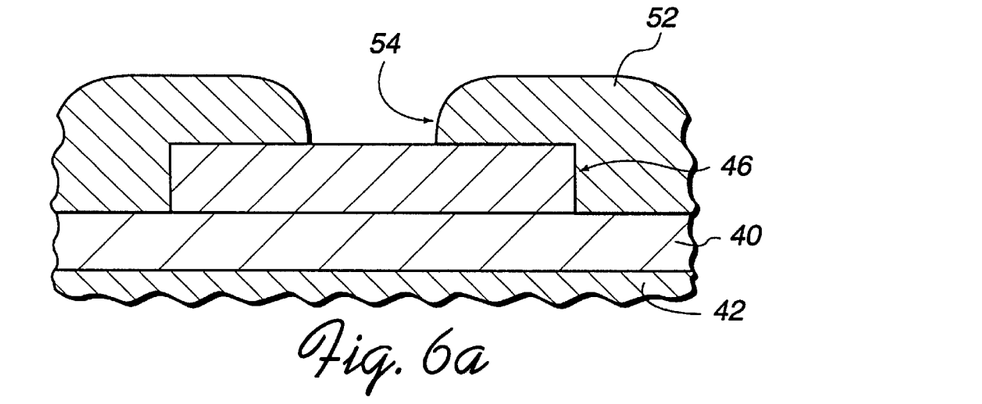
FIGS. 6a–6b are cross sections illustrating the manufacturing steps for an antifuse structure made in accordance with the steps of FIG. 6.
Figure 6B:
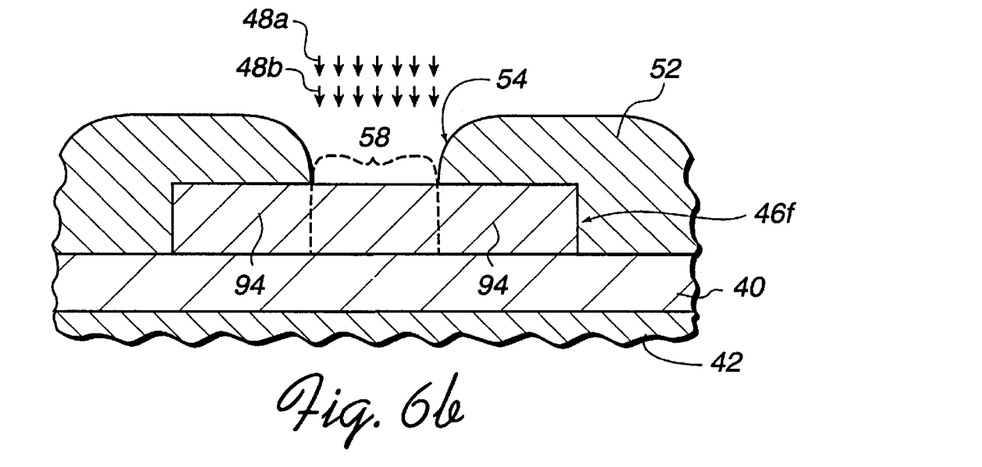

FIGS. 6a–6b illustrate the structures produced by some preferred steps of process 36c. In FIG. 6a, dielectric layer 52 with via hole 54 is formed over deposited amorphous silicon layer 46. In FIG. 6b, an enhanced amorphous silicon layer 46f is formed by dopant species ion-implantation 48b and by neutral species ion-implantation 48a of the deposited amorphous silicon layer through via 54. Enhanced amorphous silicon layer 46f therefore includes neutral species and dopant species implanted portion 58 aligned substantially with via hole 54, and non-enhanced amorphous silicon portions 94 aligned substantially below dielectric layer 52.

It will be noted that all of enhanced amorphous silicon layers 46b, 46d, 46e, and 46f of the previously described preferred antifuse structures include a neutral species and dopant species implanted portion 58 aligned substantially with via hole 54 of dielectric layer 52. An upper electrode may be formed, for example in a manner similar to the formation of second electrically conductive electrode 50 of the antifuse structure shown in FIG. 2d, such that it contacts neutral species and dopant species implanted portion 58 through via hole 54.

Neutral species ion-implantation 48a and dopant species ion-implantation 48b may be carried out according to the implant energy and density ranges given above with regard respectively to ion-implantation step 36 and deposition step 34.

Ion implantation step 36a of FIG. 3 is a preferred embodiment of the present invention. Neutral species ion-implanting step 60, prior to insulator layer forming, creates an enhanced amorphous silicon layer which protects against off-state leakage at both the via and at portions of the enhanced layer positioned beneath the insulator layer (refer to FIG. 3c showing neutral species implanted portions 56 aligned substantially below dielectric layer 52). Ion implantation step 64 further creates an enhanced amorphous silicon layer which facilitates reliable conducting link formation particularly at the insulator layer via where it is most needed.

Figure 7:
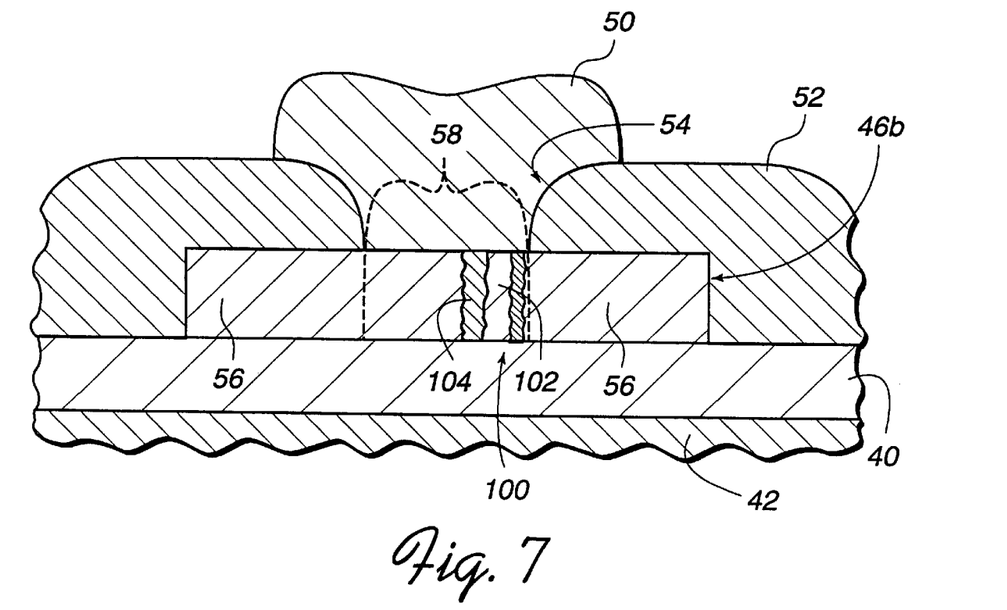
FIG. 7 is a cross section illustrating an antifuse structure of the present invention in a programmed state with an improved conducting link formed therein.

In FIG. 7, an antifuse structure of the present invention in a programmed state is illustrated with an improved conducting link formation. Upon programming by applying a sufficient voltage (e.g. 15 volts dc) an improved conducting link 100 is formed in portion 58, which has been ion implanted with a dopant species. Conducting link 100 includes a metal silicide filament 102, believed to be formed by the electro-migration of electrode material of electrodes 40 and 50 into enhanced amorphous silicon layer 46b, and doped polysilicon region 104, believed to be formed adjacent filament 102 by the heat generated during formation of filament 102. Conducting link 100 may be seen as an expanded conducting path which includes the parallel conducting paths of filament 102 and polysilicon region 104, which together ensure that the antifuse structure is adequately and reliably programmed.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. An antifuse structure comprising:
   a first conductive electrode in the form of a multi-layer electrode;
   a layer of enhanced amorphous silicon having a first surface in electrical contact with said first conductive electrode, said layer of enhanced amorphous silicon being formed by an ion-implantation of at least one of a neutral species and a dopant species into a deposited layer of amorphous silicon; and
   a second conductive electrode in electrical contact with at least a portion of a second surface of said layer of enhanced amorphous silicon.

2. An antifuse structure according to claim 1 further comprising:
   a dielectric layer formed over and in contact with said second surface of said layer of enhanced amorphous silicon and including a via hole aligned with said portion of said second surface, said second electrode contacting at least said portion of said second surface of said layer of amorphous silicon through said via hole.

3. An antifuse structure according to claim 2 wherein said layer of enhanced amorphous silicon includes a neutral species and dopant species implanted portion aligned substantially with said via hole.

4. An antifuse structure according to claim 3 wherein said layer of enhanced amorphous silicon further includes at least one exclusively neutral species implanted portion aligned substantially with said dielectric layer.

5. An antifuse structure according to claim 3 wherein said layer of enhanced amorphous silicon further includes at least one exclusively dopant species implanted portion aligned substantially with said dielectric layer.

6. An antifuse structure according to claim 3 wherein said layer of enhanced amorphous silicon further includes at least one non-enhanced amorphous silicon portion aligned substantially with said dielectric layer.

7. An antifuse structure according to claim 1 wherein said first and second electrodes are metal electrodes.

8. An antifuse structure according to claim 7 further comprising a substrate arranged in contact with said first electrode such that said first electrode is interposed between said substrate and said layer of enhanced amorphous silicon.

9. An antifuse structure according to claim 8 further comprising a plurality of logic devices in said substrate.

10. An antifuse structure according to claim 1 wherein the multi-layer electrode includes at least a TiW layer and an aluminum layer.

11. An antifuse structure according to claim 1 wherein the multi-layer electrode includes a TiW layer, an aluminum layer, and a TiW layer.

12. An antifuse structure comprising:
   a first conductive electrode;
   a layer of enhanced amorphous silicon having a first surface in electrical contact with said first conductive electrode, said layer of enhanced amorphous silicon being formed by an ion-implantation of at least one of a neutral species and a dopant species into a deposited layer of amorphous silicon;
   a second conductive electrode in electrical contact with at least a portion of a second surface of said layer of enhanced amorphous silicon; and
   a dielectric layer formed over and in contact with said second surface of said layer of enhanced amorphous silicon, the dielectric layer including a via hole that is aligned with said portion of said second surface, said second electrode contacting at least said portion of said second surface of said layer of amorphous silicon through said via hole.

13. An antifuse structure according to claim 12 wherein said layer of enhanced amorphous silicon includes a neutral species and dopant species implanted portion aligned substantially with said via hole.

14. An antifuse structure according to claim 13 wherein said layer of enhanced amorphous silicon further includes at least one exclusively neutral species implanted portion aligned substantially with said dielectric layer.

15. An antifuse structure according to claim 13 wherein said layer of enhanced amorphous silicon further includes at least one exclusively dopant species implanted portion aligned substantially with said dielectric layer.

16. An antifuse structure, comprising:

a first metallization electrode;

a layer of enhanced amorphous silicon having a first surface that is in electrical contact with said first metallization electrode, said layer of enhanced amorphous silicon is treated by an ion-implantation of at least one of a neutral species and a dopant species;

a dielectric layer formed over said second surface of said layer of enhanced amorphous silicon, the dielectric layer including a via hole that exposes a portion of said second surface; and a second metallization electrode formed over the dielectric layer and in electrical contact with the portion of a second surface of said layer of enhanced amorphous silicon.

17. An antifuse structure as recited in claim 16, wherein the neutral species is selected from the group consisting of a argon, oxygen, nitrogen, silicon, and germanium.

18. An antifuse structure as recited in claim 16, wherein the dopant species is selected from the group consisting of a phosphorous, arsenic, and boron.

19. An antifuse structure as recited in claim 16, wherein the second metallization electrode is TiW.

20. An antifuse structure as recited in claim 16, wherein the layer of enhanced amorphous silicon has a thickness of between about 400 angstroms and about 2,000 angstroms.

21. An antifuse structure as recited in claim 16, wherein the first metallization electrode includes a TiW layer, an aluminum layer, and a TiW layer.

22. An antifuse structure, comprising:

a first metallization electrode;

a layer of enhanced amorphous silicon having a thickness of between about 400 angstroms and about 2,000 angstroms, the layer of enhanced amorphous silicon has a first surface that is in electrical contact with said first metallization electrode and is treated by an ion-implantation of at least one of a neutral species and a dopant species;

a dielectric layer formed over said second surface of said layer of enhanced amorphous silicon, the dielectric layer including a via hole that exposes a portion of said second surface; and a second metallization electrode formed over the dielectric layer and in electrical contact with the portion of a second surface of said layer of enhanced amorphous silicon.

23. An antifuse structure as recited in claim 22, wherein the first metallization electrode includes a TiW layer, an aluminum layer, and a TiW layer.

24. An antifuse structure as recited in claim 22, wherein the second metallization electrode is TiW.

* * * * *